(12) United States Patent
Reiter et al.

(10) Patent No.: US 11,316,292 B2
(45) Date of Patent: Apr. 26, 2022

(54) SEMICONDUCTOR POWER MODULE AND METHOD FOR PRODUCING A SEMICONDUCTOR POWER MODULE

(71) Applicant: Infineon Technologies AG, Neubiberg (DE)

(72) Inventors: Tomas Manuel Reiter, Munich (DE); Mark Nils Muenzer, Neubiberg (DE); Marco Stallmeister, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 74 days.

(21) Appl. No.: 16/673,401

(22) Filed: Nov. 4, 2019

(65) Prior Publication Data
US 2020/0153138 A1 May 14, 2020

(30) Foreign Application Priority Data

Nov. 9, 2018 (DE) .......................... 102018128097.1

(51) Int. Cl.
*H01R 13/05* (2006.01)
*H01L 23/538* (2006.01)
(Continued)

(52) U.S. Cl.
CPC ......... *H01R 13/05* (2013.01); *H01L 23/5385* (2013.01); *H01L 23/5386* (2013.01); *H01L 24/91* (2013.01); *H01R 13/2471* (2013.01)

(58) Field of Classification Search
CPC .... H01R 13/05; H01R 13/2471; H01R 13/24; H01L 23/5386; H01L 24/91; H01L 23/5385; H01L 21/4853; H01L 23/49811; H01L 2224/291; H01L 24/32; H01L 2224/8384; H01L 2224/32227; H01L 2224/83801; H01L 2924/00014;
(Continued)

(56) References Cited

U.S. PATENT DOCUMENTS

2007/0013014 A1* 1/2007 Guo ..................... C23C 14/5873
257/417
2009/0194884 A1* 8/2009 Stolze .................. H05K 3/3426
257/773
(Continued)

FOREIGN PATENT DOCUMENTS

DE 3137570 A1 3/1983
DE 112008000229 T5 12/2009
(Continued)

*Primary Examiner* — Alexander O Williams
(74) *Attorney, Agent, or Firm* — Murphy, Bilak & Homiller, PLLC

(57) ABSTRACT

A semiconductor power module includes an electrically conductive carrier plate, a power semiconductor chip arranged on the carrier plate and electrically connected to the carrier plate, and a contact pin electrically connected to the carrier plate and forming an outer contact of the semiconductor power module. The contact pin is arranged above a soldering point. The soldering point is configured to mechanically directly or indirectly fix the contact pin on the carrier plate and to electrically connect the contact pin to the carrier plate. The contact pin is electrically connected to the carrier plate via a further connection. The further connection has a portion which is mechanically flexible in relation to the carrier plate.

17 Claims, 4 Drawing Sheets

(51) Int. Cl.
*H01L 23/00* (2006.01)
*H01R 13/24* (2006.01)

(58) Field of Classification Search
CPC ......... H01L 2224/292; H01L 2924/014; H01L 23/538; H01L 23/00
USPC ........................................................ 257/678
See application file for complete search history.

(56) References Cited

U.S. PATENT DOCUMENTS

2014/0167237 A1   6/2014  Yoo et al.
2018/0301444 A1*  10/2018  Roth .................... H01L 23/142

FOREIGN PATENT DOCUMENTS

| | | |
|---|---|---|
| DE | 102008029829 A1 | 3/2010 |
| DE | 102013211405 A1 | 12/2014 |
| DE | 102015212832 A1 | 4/2016 |
| JP | 2003046058 A | 2/2003 |

* cited by examiner

SEMICONDUCTOR POWER MODULE AND METHOD FOR PRODUCING A SEMICONDUCTOR POWER MODULE

TECHNICAL FIELD

The present disclosure relates to a semiconductor power module and to a method for producing a semiconductor power module.

BACKGROUND

A semiconductor power module can have contact pins which are designed as outer contacts of the semiconductor power module and can be connected to further electronic components, such as a printed circuit board, by means of a press fit for example. Contact pins of this kind can be fastened in the semiconductor power module by means of soldering points. It should be stated here that soldered connections generally have a (considerably) higher error rate than is the case for press fits. In order to meet increasing requirements in respect of the reliability of semiconductor power modules, it is therefore necessary to provide an improved connection, that is to say a connection with a lower electrical failure rate, of contact pins to semiconductor power modules.

The object on which the invention is based is achieved by the features of the independent patent claims. Advantageous refinements and developments of the invention are specified in the dependent claims.

SUMMARY

Individual examples relate to a semiconductor power module comprising an electrically conductive carrier plate, a power semiconductor chip which is arranged on the carrier plate and is electrically connected to said carrier plate, and a contact pin which is electrically connected to the carrier plate and forms an outer contact of the semiconductor power module, wherein the contact pin is arranged above a soldering point, wherein the soldering point is configured to mechanically directly or indirectly fix the contact pin on the carrier plate and to electrically connect said contact pin to the carrier plate, and wherein the contact pin is electrically connected to the carrier plate via a further connection, wherein the further connection has a portion which is mechanically flexible in relation to the carrier plate.

Individual examples relate to a method for producing a semiconductor power module, the method comprising: providing an electrically conductive carrier plate, arranging a power semiconductor chip on the carrier plate and electrically connecting the power semiconductor chip to the carrier plate, forming a first soldering point on the carrier plate, arranging a contact pin above the first soldering point in such a way that the contact pin is mechanically directly or indirectly fixed on the carrier plate and is electrically connected to the carrier plate by means of the first soldering point, and forming a further connection by means of which the contact pin is electrically connected to the carrier plate, wherein the further connection has a portion which is mechanically flexible in relation to the carrier plate.

BRIEF DESCRIPTION OF THE DRAWINGS

The accompanying drawings illustrate examples and together with the description serve to explain the principles of the disclosure. The elements in the drawings are not necessarily true to scale with respect to one another. Identical reference signs may designate mutually corresponding, similar or identical parts.

FIG. 1A shows that a contact pin is mechanically indirectly fitted on a carrier plate, and FIG. 1B shows how the electrical contact to the contact pin remains unaffected by the further connection when said electrical contact has been detached from the carrier plate due to mechanical loading.

FIGS. 3A and 3B show a sleeve with a further connection fastened to it, wherein FIG. 3A shows a schematic side view and FIG. 3B shows a plan view.

FIGS. 4A and 4B show a sleeve with an integral further connection, wherein FIG. 4A shows a schematic side view and FIG. 4B shows a plan view.

DETAILED DESCRIPTION

The semiconductor power modules described below can be designed, for example, to process high currents, such as currents of 10 A, 100 A or 1000 A for example, and high voltages, such as voltages of 100 V, 400 V, 800 V or 1200 V for example. The semiconductor power modules can be operated, for example, as converters.

The semiconductor power modules described below can have different types of semiconductor chips, for example power semiconductor chips such as power MOSFETs (metal-oxide-semiconductor field-effect transistors), IGBTs (insulated-gate bipolar transistors), JFETs (junction field-effect transistors), power bipolar transistors or power diodes for example. Furthermore, the semiconductor power modules can have logic chips such as control circuits or microprocessors for controlling the power semiconductor chips. The semiconductor chips can be produced from semiconductor material such as Si, SiC, SiGe, GaAs or GaN for example.

The semiconductor power modules described below have contact pins and in some cases sleeves too. The contact pins and the sleeves can consist, for example, of a metal such as Al, Au, Ag, Cu or Fe or of a metal alloy such as CuSn. The contact pins can have any desired suitable geometry and size and can have, for example, a length of a few millimeters, for example 5 mm, 10 mm or 15 mm, or a few centimeters, for example 1 cm, 2 cm, 5 cm or 10 cm, and a diameter of one or more millimeters, for example 2 mm, 3 mm, 4 mm, 5 mm or more. The semiconductor power modules described below can have soldered connections and/or sintered connections. The solder material can comprise, for example, Sn, Ag or Cu or consist thereof. The sintered material can likewise comprise one or more of these metals or consist thereof. The sintered material can be applied to a surface of a carrier plate of the semiconductor power module in the form of a metal powder.

Figure 1A:
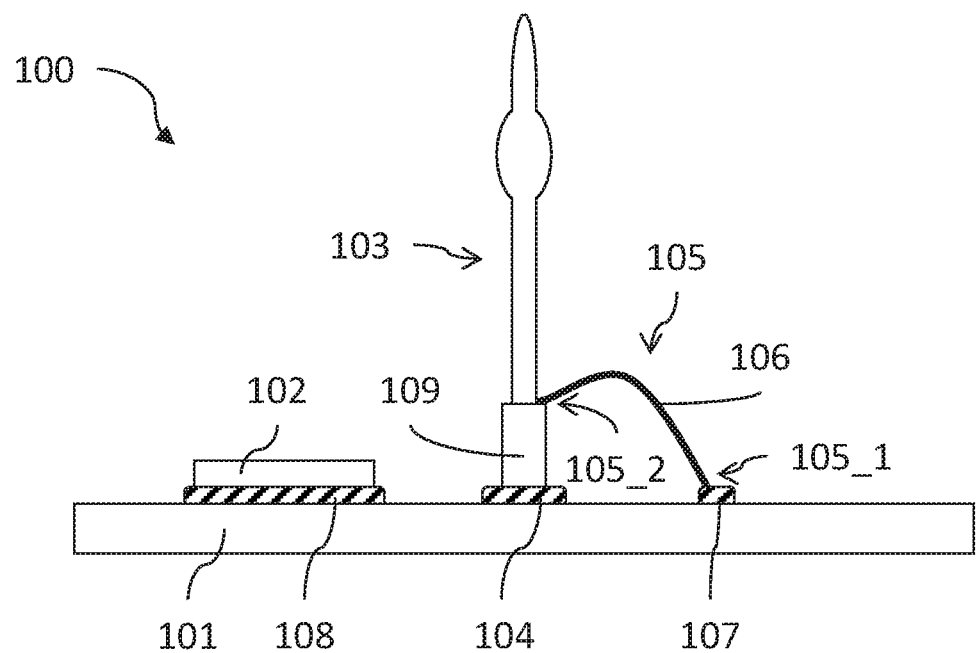
FIGS. 1A and 1B show a schematic side view of an example of a semiconductor power module.

FIG. 1A shows a semiconductor power module 100 having an electrically conductive carrier plate 101 (that is to say a structured carrier plate which has electrically conductive regions), a power semiconductor chip 102 which is arranged on the carrier plate 101 and is electrically connected to said carrier plate, and a contact pin 103 which is electrically connected to the carrier plate and forms an outer contact of the semiconductor power module 100. The contact pin 103 is arranged above a first soldering point 104, the first soldering point 104 being configured to mechanically indirectly fix the contact pin 103 on the carrier plate 101 and to electrically connect said contact pin to the carrier plate 101. The contact pin 103 is further electrically connected to the carrier plate 101 via a further connection 105, wherein the further connection 105 has a portion 106 which is mechanically flexible in relation to the carrier plate 101. The mechanically flexible portion can be designed to decouple the further connection 105 from mechanical loading which acts on the further connection 105. The mechanically flexible portion 106 can be flexible about one axis, about two axes or else about three axes. The mechanically flexible portion 106 can have a comparatively low modulus of elasticity, also called coefficient of elasticity, in particular a comparatively low bending stiffness. The modulus of elasticity of the mechanically flexible portion 106 can correspond, for example, to the typical modulus of elasticity of a bonding wire or ribbon.

The further connection can be connected, at a first end 105_1, to the carrier substrate 101 by means of a first contact point 107. The first contact point 107 can be a second soldering point or a welded contact (for example an ultrasonic welding) or a sintered contact. The further connection can be connected, at a second end 105_2, to the contact pin 101 by means of a second contact point (not shown). The second contact point can be a soldering point or a welded contact (for example an ultrasonic welding) or a sintered contact. According to one example, the further connection 105 can have a conductive wire or a conductive strip or consist thereof, for example a bonding wire. In this case, the flexible portion 106 can extend over (almost) the entire length of the further connection. A distance between the first soldering point 104 and the first contact point 107 on the carrier substrate 101 can lie in an order of magnitude of a few millimeters to a few centimeters and can be, for example, approximately 2 mm, 5 mm, 10 mm, 15 mm, 2 cm or more.

The carrier plate 101 can be any desired substrate which is suitable for use in the semiconductor power module 100 and can be, for example, a substrate of the DCB (direct copper bond), DAB (direct aluminum bond) or AMB (active metal brazing) type. The power semiconductor chip 102 can be electrically and mechanically connected to the carrier plate 101 by means of a third soldering point 108. The contact pin 103 can be electrically connected to the power semiconductor chip 102, for example by means of a conductor track which is formed on the carrier plate 101. The contact pin 103 can represent, for example, an outer contact to a gate electrode or a power electrode, such as an emitter electrode of the power semiconductor chip 102. The contact pin 103 can also represent an outer contact for a sensor in the semiconductor power module 100, for example a temperature sensor. The semiconductor power module 100 can have a large number of contact pins 103.

According to one example, the first soldering point 104 and/or the third soldering point 108 can also be a different type of contact point, for example a sintered connection or a welded contact.

The semiconductor power module 100 can have a housing (not shown) by way of which the power semiconductor chip 102 and possibly the entire top side of the carrier plate 101 is enclosed. The housing can be, for example, a prefabricated plastic housing which is plug-mounted, screwed or adhesively bonded onto the carrier plate 101. The upper end of the contact pin 103 can protrude out of the housing. To this end, the housing can have an eye through which the contact pin 103 runs. The upper end of the contact pin 103 can further be designed to form a press fit, for example with an external (control) printed circuit board (a contact pin of this kind is sometimes also called a "compliant pin"). A press fit of this kind represents a so-called cold welding.

In the semiconductor power module 100, the contact pin 103 is indirectly fixed on the carrier plate 101. That is to say that the contact pin 103 is fitted to the first soldering point 104 via an intermediate connection. According to one example, this intermediate connection may be a sleeve 109 into which the contact pin 103 is pushed. A press fit can be formed between the contact pin 103 and the sleeve 109. The sleeve 109 can consist, for example, of a metal or a metal alloy. The base of the sleeve 109 is directly fitted to the first soldering point 104 and mechanically and electrically connected to the carrier substrate 101 by said first soldering point. According to one example, the sleeve 109 does not have a base, but rather has an opening at both ends. In this case, the lower edge of the sleeve 109 can be fitted to the first soldering point 104. This edge can have, for example, a widened collar. According to one example, the contact pin 103 can be pushed into the sleeve 109 after said sleeve has been fitted to the first soldering point 104. According to another example, the sleeve 109 can be fitted to the first soldering point 104 with the contact pin 103 already pushed in.

The second end 105_2 of the further connection 105 can be fastened to the sleeve 109, for example to a surface which is located at the upper or lower end of the sleeve 109 and is oriented parallel in relation to the carrier plate 101. However, it is also possible for the second end 105_2 to be fastened to a vertical surface of the sleeve 109. According to a further example, it is also possible for the second end 105_2 to not be fastened to the sleeve 109, but rather to the contact pin 103 above the sleeve 109.

Soldering points such as the first soldering point 104 can represent a weak point in the case of mechanical loadings, for example due to oscillations, shocks or thermal stresses, which act on the semiconductor power module 100. In particular, soldering points of this kind can have a higher error rate than, for example, can be achieved by press fits. A crack in the first soldering point 104 can have the effect that the electrical contact between the contact pin 103 and the carrier plate 101 via the first soldering point 104 is adversely affected or even entirely lost. However, the electrical contact between the contact pin 103 and the carrier plate 101 via the further connection 105 is also ensured in this case.

Figure 1B:
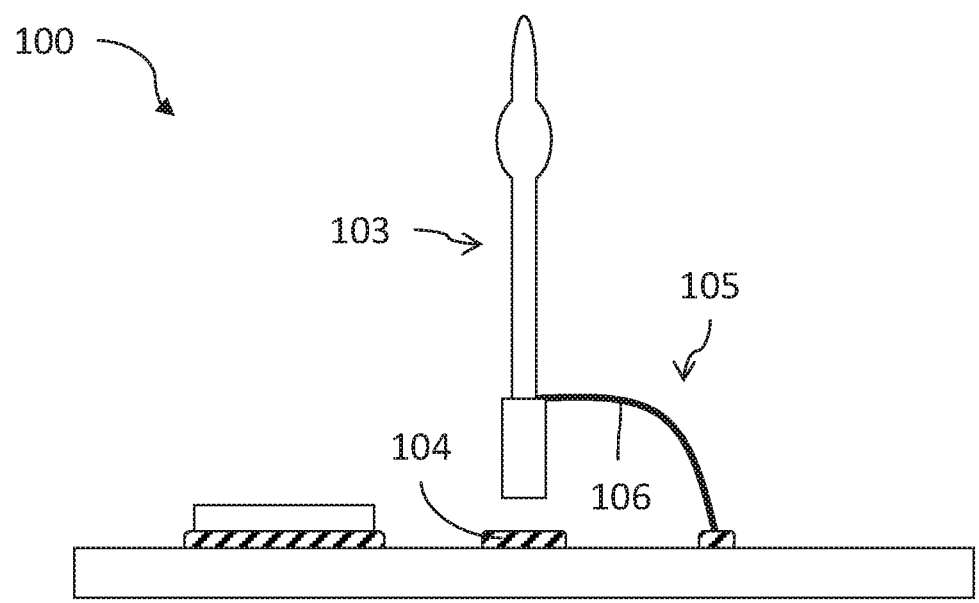

FIG. 1B shows the case of the contact pin 103 being completely broken off from the first soldering point 104 due to mechanical loading. The contact pin 103 can, at the upper end, still be fixed in a specified storage region by the housing (not shown) or by a control printed circuit board (not shown), but the electrical connection to the carrier plate via the soldering point 104 is interrupted. However, the further connection 105 has the mechanically flexible portion 106 which mechanically decouples the further connection 105 from the carrier plate 101. Therefore, the further connection 105 has not been severed due to the mechanical loading and would therefore still ensure the electrical contact between the carrier plate 101 and the contact pin 103. In particular, the further connection 105 can be designed to completely replace an electrical connection via the first soldering point 104, so that no difference from an intact first soldering point 104 can be identified during operation of the semiconductor module 100. Furthermore, the further connection can also serve to limit the position of the end of the contact pin 103, which end is now no longer fixed, above the carrier plate 101 such that undesired contact with other conductors on the carrier plate 101 cannot be established.

Figure 2:
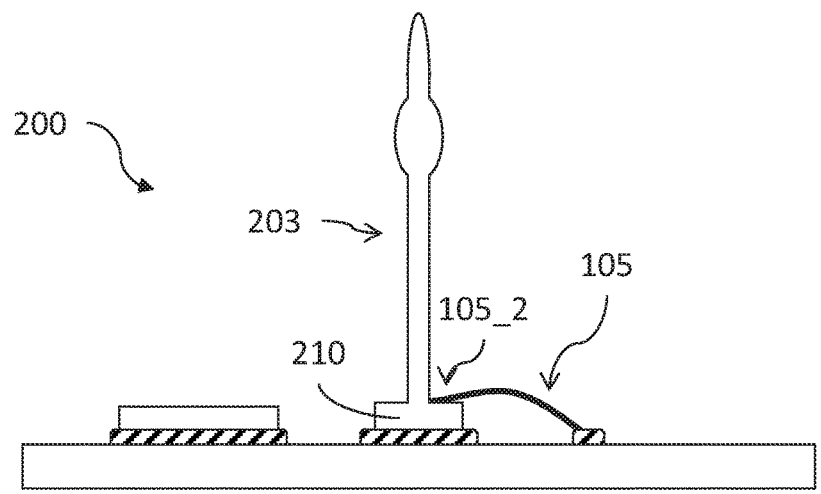
FIG. 2 shows a schematic side view of a semiconductor power module in which a contact pin is mechanically directly fastened on a carrier plate.

FIG. 2 shows a semiconductor power module 200 which can be identical to the semiconductor power module 100 of FIG. 1, apart from the differences outlined below.

The semiconductor power module 200 differs from the semiconductor power module 100 substantially in that the contact pin 203 is mechanically directly and not indirectly fixed on the carrier plate 101. This means that a lower end of the contact pin 203 is directly fitted on the first soldering point 104 and there is no intermediate connection, such as the sleeve 109, arranged between the contact pin 203 and the first soldering point 104.

To this end, the contact pin 203 can have a foot 210 which is an integral constituent part of the contact pin 203. The foot 210 can have a larger diameter than the rest of the contact pin 203, for example a diameter which suffices to fix the contact pin 203 on the carrier plate in a stable manner via the first soldering point 104. The foot 210 can have a flattened top side. The second end 105_2 of the further connection 105 can be fastened, for example, to the flattened top side of the foot 210. The contact pin 203 can be designed, analogously to the contact pin 103, to form a press-fit connection with an external printed circuit board.

Figure 3A:
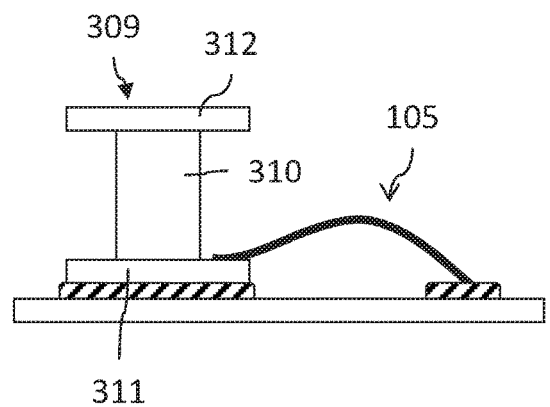
Figure 3B:
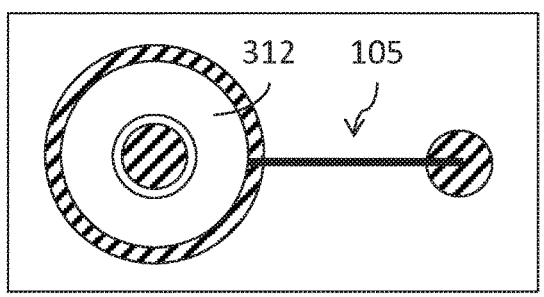

FIGS. 3A and 3B show a view of a detail of a sleeve 309 and further connection 105 of the semiconductor module 100 according to one example. FIG. 3A shows a side view, and FIG. 3B shows a plan view.

The sleeve 309 can be similar to the sleeve 109 or can even be identical thereto. The sleeve 309 has a central part 310 with a relatively small diameter, and also respectively widened edges 311, 312 on the lower and the upper side. The lower widened edge 311 can serve to fasten the sleeve 309 to the first soldering point 104 in a stable manner and thereby allow the sleeve 309 or a contact pin 103 which is inserted into the sleeve 309 to stand securely on the carrier plate 101. The upper widened edge 312 can make it easier to insert the contact pin 103 into the sleeve 309.

The further connection 105 can be fitted, for example, to the lower widened edge 311, as shown in FIG. 3A, but it can also be attached, for example, to the upper widened edge 312. The widened edges 311, 312 can simplify the work of a connecting tool which is used to fit the further connection 105 to the sleeve 309 (for example a bonding tool).

Figure 4A:
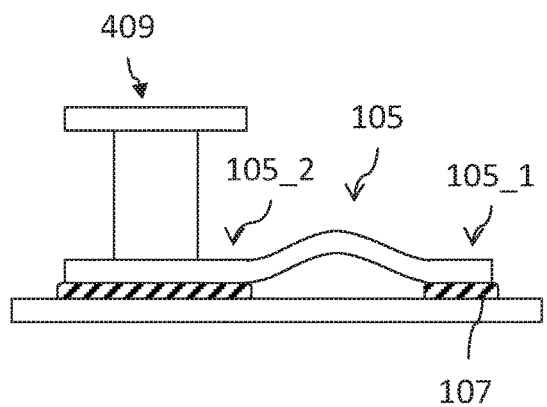
Figure 4B:
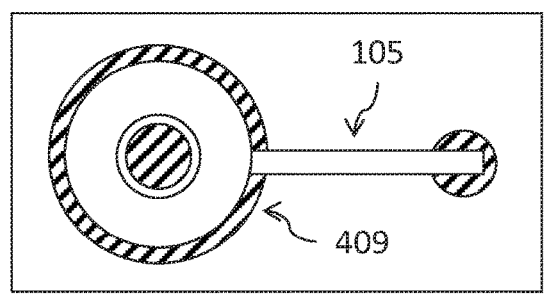

FIGS. 4A and 4B show a view of a detail of a sleeve 409 and further connection 105 of the semiconductor module 100 according to a further example. FIG. 4A shows a side view, and FIG. 4B shows a plan view.

The sleeve 409 can be similar to the sleeve 109 or to the sleeve 309 and can differ therefrom mainly in that the further connection 105 is an integral constituent part of the sleeve 409. In other words, the further connection 105 forms a foot of the sleeve 409, which foot protrudes laterally from the sleeve 409 and is connected to the carrier plate via the first contact point 107 (which can be a soldering point or a welded contact or a sintered contact). However, a central piece of the further connection 105 is not mechanically connected to the carrier plate. The further connection 105 can be, for example, a strip of conductive material which adjoins the lower widened edge 311.

The further connection 105 can, as shown in FIG. 4A, span the carrier plate 101 in an arcuate manner. The arc can protrude, for example, a few millimeters above the carrier plate 101 or else be bent to the side in a plane parallel to the carrier plate, for example by approximately 2 mm, 5 mm, 10 mm, 15 mm or more. However, it is also possible for the further connection 105 to not have an arc of this kind and instead to run in a substantially flat manner (parallel to the carrier plate 101). However, the further connection 105 can also be fitted, in this case only at its first end 105_1, to the carrier plate 101 and have, between the first end 105_1 and the second end 105_2, a portion which is not fitted to a contact point (that is to say a soldering point or a welded contact or a sintered contact) and therefore represents the portion of the further connection 105 that is mechanically flexible in relation to the carrier plate 101. In comparison to the profile of the further connection 105 parallel to the carrier plate 101, the arcuate profile can have, however, the advantage of an additional clearance which has the effect that the further connection 105 breaks only after passing this clearance in the event of mechanical loading. The clearance can have, for example, a length of approximately 2 mm, 5 mm, 10 mm, 15 mm, 20 mm or more.

FIGS. 5A to 5D each show a view of a detail of contact pins 503 and, respectively, 503' and the further connection 105 according to examples of the semiconductor power module 200. The contact pins 503 and 503' can be similar or even identical to the contact pin 203, apart from the differences described below.

Figure 5A:
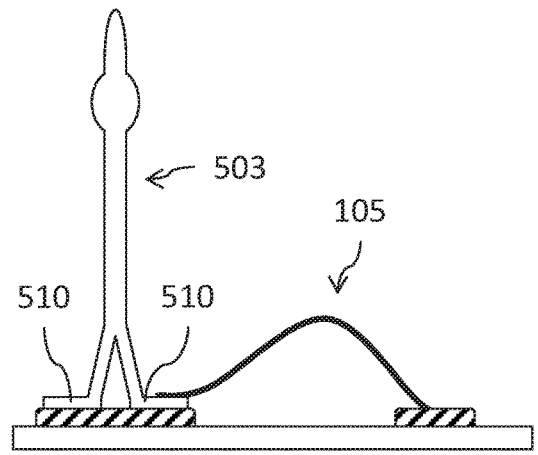
FIGS. 5A to 5D show various examples of a contact pin which is mechanically directly fastened on a carrier plate of a semiconductor power module.

According to the example of FIG. 5A, the contact pin 503 has two or more feet 510 which are fitted directly on the first soldering point 104. A refinement of the sleeve from FIG. 1A with two or more feet according to FIG. 5A would likewise be possible too. The feet 510 can be integral constituent parts of the contact pin 503. The contact pin 503 can have, for example, two opposite feet 510, as shown in FIG. 5A. The further connection 105 can be fastened, for example, to a flat top side of one of the feet 510.

Figure 5B:
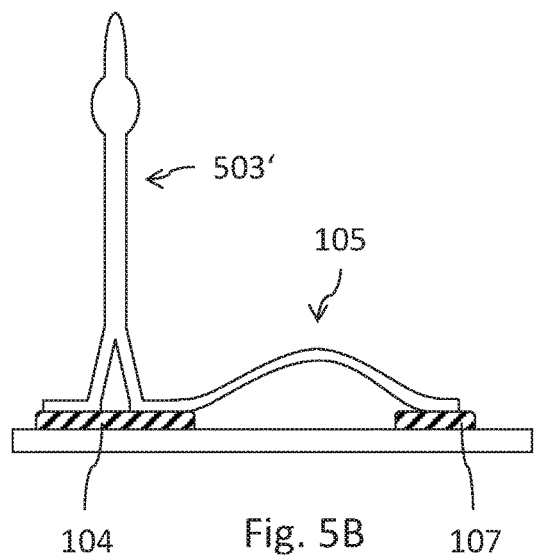

According to the example of FIG. 5B, the contact pin 503' has two or more feet 510. However, in contrast to the example of FIG. 5A, the further connection 105 is not fitted to the contact pin 503' but rather represents an integral part of said contact pin, analogously to the example of the sleeve 409 shown in FIG. 4A. For example, at least one of the feet 510 can be dimensioned such that it can be fastened to the first soldering point 104 by way of a first end and can be fastened to the first contact point 107 by way of a second end.

Figure 5C:
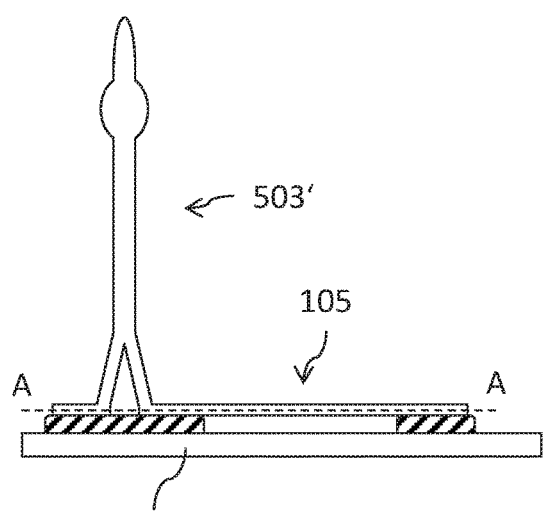

As shown in the example of FIG. 5C, the further connection 105 of the contact pin 503' does not necessarily have to span an arc over the carrier plate 101, but rather can also run (substantially) parallel to the carrier plate 101.

Figure 5D:
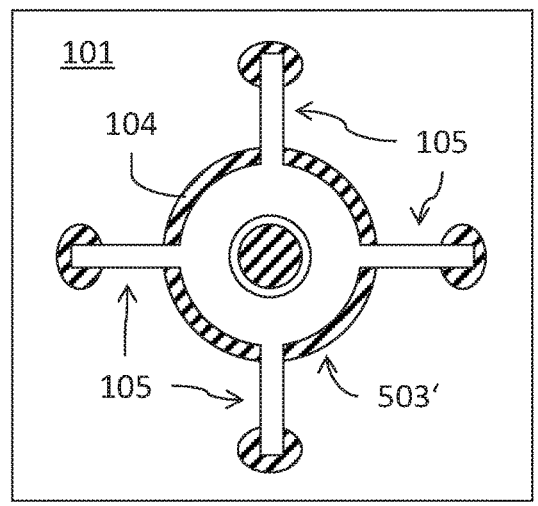

FIG. 5D shows a sectional view of a further possible embodiment of the contact pin 503' along the line A-A in FIG. 5C. In the embodiment shown in FIG. 5D, the contact pin 503' has more than one further connection 105, in particular four further connections 105, which lead radially away from the contact pin 503'. A refinement of this kind can have the advantage that the contact pin 503' can be fastened on the carrier plate 101 in a particularly stable manner. A further advantage can be that, in the event of particularly high mechanical loading which severs not only the first soldering point 104 but also one or more of the further connections 105, at least one further connection 105 could still remain intact. It is also possible in the embodiment of FIG. 5D for the further connections to span an arc over the carrier plate 101, as shown in FIG. 5B for example. One or more of the first soldering point 104 and the first contact points 107 can also be, for example, a welded connection or a sintered connection.

It is also possible for a refinement, as shown in FIG. 5D, with, for example, four radially arranged further connections 105 to be used, for example, in the contact pin 503 of FIG. 5A in which the further connections 105 are not integral constituent parts of the contact pin 503. Furthermore, it is possible for a refinement as shown in FIG. 5D to be used in a sleeve, such as the sleeve 309 or the sleeve 409.

Figure 6:
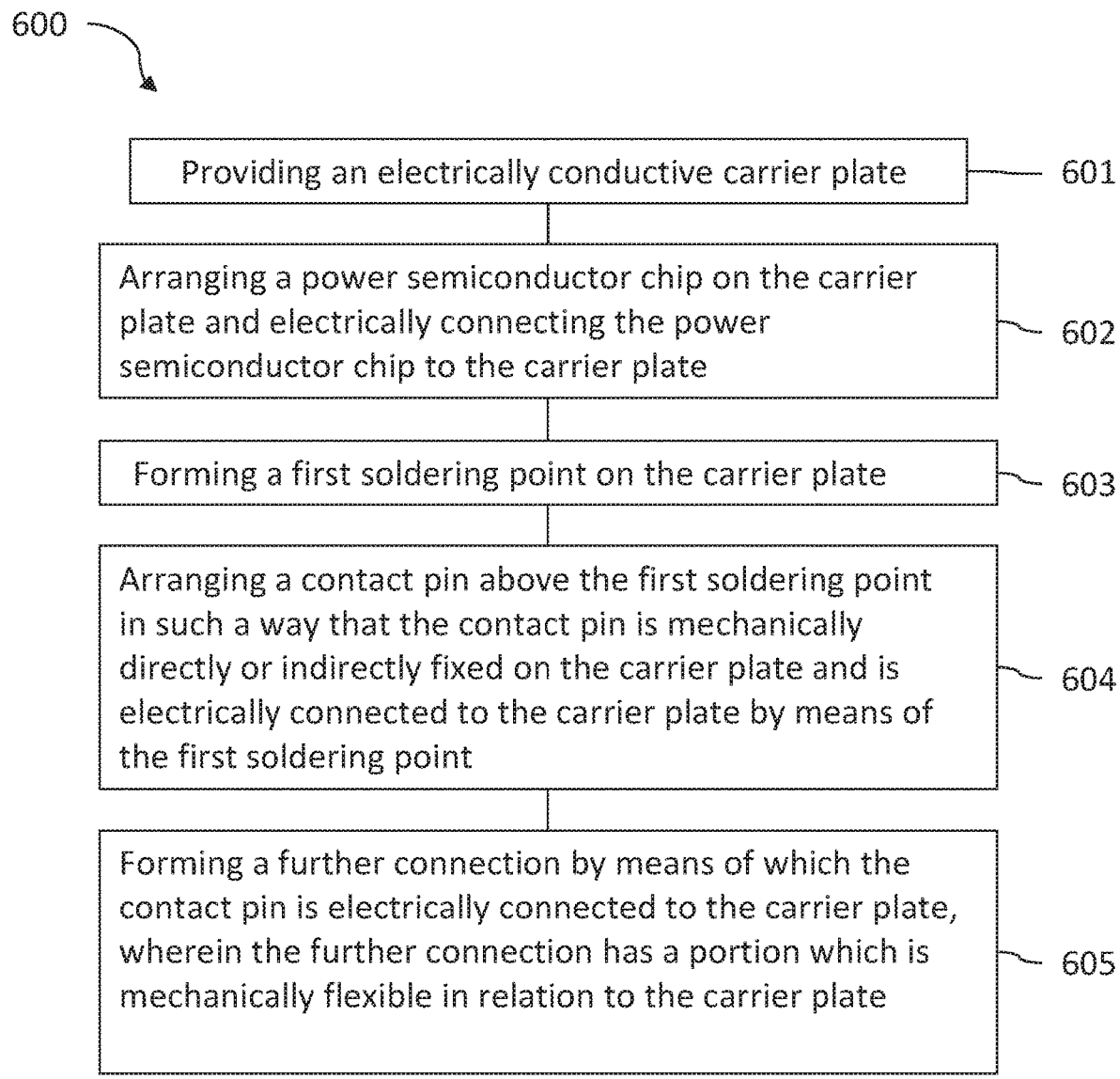
FIG. 6 shows a flowchart of a method for producing a semiconductor power module.

FIG. 6 shows a flowchart of a method 600 for producing a semiconductor power module like the semiconductor power modules 100 and 200.

The method 600 comprises providing an electrically conductive carrier plate in step 601, arranging a power semiconductor chip on the carrier plate and electrically connecting the power semiconductor chip to the carrier plate in step 602, forming a first soldering point on the carrier plate in step 603, arranging a contact pin above the first soldering point in such a way that the contact pin is mechanically directly or indirectly fixed on the carrier plate and is electrically connected to the carrier plate by means of the first soldering point in step 604, and forming a further connection by means of which the contact pin is electrically connected to the carrier plate, wherein the further connection has a portion which is mechanically flexible in relation to the carrier plate, in step 605.

According to one example of the method 600, arranging the contact pin above the first soldering point can comprise arranging a sleeve above the first soldering point, mechanically and electrically connecting the sleeve and the carrier plate by means of the first soldering point, and pushing the contact pin into the sleeve in such a way that a press fit is formed between the contact pin and the sleeve. According to one example of the method 600, the further connection can have a further soldering point. The first soldering point and the further soldering point can be formed at the same time, for example in a reflow oven. However, it is also possible for the further soldering point to be formed after the first soldering point has been formed.

The semiconductor power module and the method for producing a semiconductor power module will be explained in more detail below using examples.

Example 1 is a semiconductor power module comprising an electrically conductive carrier plate, a power semiconductor chip which is arranged on the carrier plate and electrically connected to said carrier plate, and a contact pin which is electrically connected to the carrier plate and forms an outer contact of the semiconductor power module, wherein the contact pin is arranged above a soldering point which is designed to mechanically directly or indirectly fix the contact pin on the carrier plate and to electrically connect said contact pin to the carrier plate, and wherein the contact pin is electrically connected to the carrier plate via a further connection, wherein the further connection has a portion which is mechanically flexible in relation to the carrier plate.

Example 2 is a semiconductor power module according to example 1, wherein the contact pin is mechanically indirectly fixed on the carrier plate, the semiconductor power module further comprising: a sleeve which is connected to the carrier plate by the soldering point, wherein the contact pin is pushed into the sleeve and forms a press fit with the sleeve.

Example 3 is a semiconductor power module according to example 1, wherein the contact pin is mechanically directly fixed on the carrier plate in such a way that the contact pin has a foot which is directly fitted on the soldering point.

Example 4 is a semiconductor power module according to one of the preceding examples, wherein the further connection has a conductive wire or a conductive strip.

Example 5 is a semiconductor power module according to one of the preceding examples, wherein the further connection has, at a first end, a further soldering point or a welded contact or a sintered contact which is arranged on the carrier plate.

Example 6 is a semiconductor power module according to example 2, wherein a second end of the further connection is fitted to the sleeve.

Example 7 is a semiconductor power module according to example 2, wherein the further connection forms a foot of the sleeve, which foot protrudes laterally from the sleeve and is connected to the carrier plate via a further soldering point or a welded contact or a sintered contact.

Example 8 is a semiconductor power module according to example 3, wherein the further connection has a lateral extension of the foot, which lateral extension is connected to the carrier plate via a further soldering point or a welded contact or a sintered contact.

Example 9 is a method for producing a semiconductor power module, the method comprising: providing an electrically conductive carrier plate, arranging a power semiconductor chip on the carrier plate and electrically connecting the power semiconductor chip to the carrier plate, forming a first soldering point on the carrier plate, arranging a contact pin above the first soldering point in such a way that the contact pin is mechanically directly or indirectly fixed on the carrier plate and is electrically connected to the carrier plate by means of the first soldering point, and forming a further connection by means of which the contact pin is electrically connected to the carrier plate, wherein the further connection has a portion which is mechanically flexible in relation to the carrier plate.

Example 10 is a method according to example 9, wherein the contact pin is mechanically indirectly fixed on the carrier plate, the method further comprising: arranging a sleeve above the carrier plate, mechanically and electrically connecting the sleeve and the carrier plate by means of the first soldering point, and pushing the contact pin into the sleeve in such a way that a press fit is formed between the sleeve and the contact pin.

Example 11 is a method according to example 9, wherein the contact pin is mechanically directly fixed on the carrier plate in such a way that the contact pin has a foot, wherein the foot is fitted directly on the first soldering point.

Example 12 is a method according to one of examples 9 to 11, wherein the further connection has a further soldering point.

Example 13 is a method according to example 12, wherein the first soldering point and the further soldering point are formed in a reflow oven at the same time.

Example 14 is a method according to example 12, wherein the further soldering point is formed after the first soldering point has been formed.

Example 15 is a method according to one of examples 9 to 11, wherein the further connection comprises a welded contact or a sintered contact.

Example 16 is a method according to one of examples 9 to 15, wherein the further connection comprises a conductive wire or a conductive strip.

Example 17 is a method according to one of examples 9 to 16, wherein the mechanically flexible portion is designed to decouple the further connection from mechanical loading which acts on the further connection.

Example 18 relates to an apparatus comprising means in order to execute a method according to one of examples 9 to 17.

Although specific embodiments have been depicted and described herein, it is obvious to a person of average skill in the art that a large number of alternative and/or equivalent implementations can replace the specific embodiments shown and described without departing from the scope of the present disclosure. This application is intended to cover all adaptations or variations of the specific embodiments discussed herein. The intention is therefore for this disclosure to be restricted only by the claims and the equivalents thereof.

What is claimed is:

1. A semiconductor power module, comprising:
an electrically conductive carrier plate;
a power semiconductor chip arranged on the carrier plate and electrically connected to the carrier plate; and
a contact pin electrically connected to the carrier plate and forming an outer contact of the semiconductor power module,
wherein the contact pin is arranged above a soldering point,
wherein the soldering point is configured to mechanically directly or indirectly fix the contact pin on the carrier plate and to electrically connect the contact pin to the carrier plate,
wherein the contact pin is electrically connected to the carrier plate via a further connection having a portion which is mechanically flexible in relation to the carrier plate.

2. The semiconductor power module of claim 1, wherein the contact pin is mechanically indirectly fixed on the carrier plate, the semiconductor power module further comprising:
a sleeve connected to the carrier plate by the soldering point,
wherein the contact pin is pushed into the sleeve and forms a press fit with the sleeve.

3. The semiconductor power module of claim 2, wherein a second end of the further connection is fitted to the sleeve.

4. The semiconductor power module of claim 2, wherein the further connection forms a foot of the sleeve, which foot protrudes laterally from the sleeve and is connected to the carrier plate via a further soldering point or a welded contact or a sintered contact.

5. The semiconductor power module of claim 1, wherein the contact pin is mechanically directly fixed on the carrier plate such that the contact pin has a foot which is directly fitted on the soldering point.

6. The semiconductor power module of claim 5, wherein the further connection has a lateral extension of the foot, and wherein the lateral extension is connected to the carrier plate via a further soldering point or a welded contact or a sintered contact.

7. The semiconductor power module of claim 1, wherein the further connection has a conductive wire or a conductive strip.

8. The semiconductor power module of claim 1, wherein the further connection has, at a first end, a further soldering point or a welded contact or a sintered contact which is arranged on the carrier plate.

9. A method for producing a semiconductor power module, the method comprising:
providing an electrically conductive carrier plate;
arranging a power semiconductor chip on the carrier plate and electrically connecting the power semiconductor chip to the carrier plate;
forming a first soldering point on the carrier plate;
arranging a contact pin above the first soldering point such that the contact pin is mechanically directly or indirectly fixed on the carrier plate and is electrically connected to the carrier plate by the first soldering point; and
forming a further connection which electrically connects the contact pin to the carrier plate, the further connection having a portion which is mechanically flexible in relation to the carrier plate.

10. The method of claim 9, wherein the contact pin is mechanically indirectly fixed on the carrier plate, the method further comprising:
arranging a sleeve above the carrier plate;
mechanically and electrically connecting the sleeve and the carrier plate by the first soldering point; and
pushing the contact pin into the sleeve such that a press fit is formed between the sleeve and the contact pin.

11. The method of claim 9, wherein the contact pin is mechanically directly fixed on the carrier plate such that the contact pin has a foot, and wherein the foot is fitted directly on the first soldering point.

12. The method of claim 9, wherein the further connection has a further soldering point.

13. The method of claim 12, wherein the first soldering point and the further soldering point are formed in a reflow oven at the same time.

14. The method of claim 12, wherein the further soldering point is formed after the first soldering point is formed.

15. The method of claim 9, wherein the further connection has a welded contact or a sintered contact.

16. The method of claim 9, wherein the further connection comprises a conductive wire or a conductive strip.

17. The method of claim 9, wherein the mechanically flexible portion is configured to decouple the further connection from mechanical loading which acts on the further connection.

* * * * *